US011189467B2

United States Patent
Park et al.

(10) Patent No.: US 11,189,467 B2
(45) Date of Patent: Nov. 30, 2021

(54) APPARATUS AND METHOD OF ATTACHING PAD ON EDGE RING

(71) Applicant: Samsung Electronics Co., Ltd., Suwon-si (KR)

(72) Inventors: Jin-Uk Park, Hwaseong-si (KR); Sun-Ho Kim, Seoul (KR); Sung-Jin Kim, Suwon-si (KR); Jong-Geug Kim, Suwon-si (KR); Kyu-Chul Shim, Hwaseong-si (KR); Ji-Hoon Yeo, Hwaseong-si (KR); Shin-Sang Lee, Seoul (KR); Gyu-Chan Jeoung, Hwaseong-si (KR); Sung-Wook Jung, Seoul (KR); Jae-Chul Hwang, Seoul (KR)

(73) Assignee: Samsung Electronics Co., Ltd.

( * ) Notice: Subject to any disclaimer, the term of this patent is extended or adjusted under 35 U.S.C. 154(b) by 227 days.

(21) Appl. No.: 16/444,590

(22) Filed: Jun. 18, 2019

(65) Prior Publication Data

US 2020/0161099 A1    May 21, 2020

(30) Foreign Application Priority Data

Nov. 20, 2018    (KR) .................. 10-2018-0143663

(51) Int. Cl.
*H01J 37/32*    (2006.01)
*H01L 21/687*    (2006.01)

(52) U.S. Cl.
CPC .. *H01J 37/32642* (2013.01); *H01J 37/32724* (2013.01); *H01J 37/32834* (2013.01); *H01L 21/68721* (2013.01); *H01L 21/68735* (2013.01); *H01J 2237/334* (2013.01)

(58) Field of Classification Search
CPC .......... H01J 37/32642; H01J 37/32724; H01J 37/32834; H01J 2237/334; H01L 21/68721; H01L 21/68792; H01L 21/68735; H01L 21/68742
See application file for complete search history.

(56) References Cited

U.S. PATENT DOCUMENTS

| 7,275,577 B2 | 10/2007 | Seok et al. |
| 7,886,793 B2 | 2/2011 | Seok et al. |
| 8,833,423 B2 | 9/2014 | Masao et al. |
| 2002/0029963 A1* | 3/2002 | Yoshioka ............. C25D 17/001 204/224 R |

(Continued)

FOREIGN PATENT DOCUMENTS

| JP | 2577103 | 1/1997 |
| JP | 2009295847 A * | 12/2009 |

(Continued)

*Primary Examiner* — Yuechuan Yu
(74) *Attorney, Agent, or Firm* — Myers BigeL P.A.

(57) ABSTRACT

An apparatus for attaching a pad on or to an edge ring includes a chamber defining a space for attaching a pad on or to an edge ring, a pad support within the chamber and supporting the pad thereon, an edge ring support within the chamber and facing the pad support, the edge ring support securing the edge ring thereon, a driving system connected to at least one of the pad support and the edge ring support and configured to move the edge ring support relative to the pad support, and a vacuum exhaust system configured to create a vacuum atmosphere within the chamber.

19 Claims, 18 Drawing Sheets

(56) References Cited

U.S. PATENT DOCUMENTS

| | | | |
|---|---|---|---|
| 2004/0095546 A1* | 5/2004 | Lee | B32B 37/26 |
| | | | 349/187 |
| 2004/0131766 A1* | 7/2004 | Katsuoka | C23C 18/1886 |
| | | | 427/98.5 |
| 2005/0199337 A1 | 9/2005 | Toshirou et al. | |
| 2018/0021918 A1* | 1/2018 | Nagengast | H01L 21/67092 |
| | | | 451/364 |

FOREIGN PATENT DOCUMENTS

| | | |
|---|---|---|
| JP | 4850721 | 1/2012 |
| KR | 0720447 | 5/2007 |
| KR | 100991078 B1 * | 10/2010 |
| KR | 1337551 | 5/2013 |
| KR | 1509660 | 4/2015 |
| KR | 1545192 | 8/2015 |
| KR | 1748425 | 3/2017 |

* cited by examiner

APPARATUS AND METHOD OF ATTACHING PAD ON EDGE RING

PRIORITY STATEMENT

This application claims priority under 35 U.S.C. § 119 to Korean Patent Application No. 10-2018-0143663, filed on Nov. 20, 2018 in the Korean Intellectual Property Office (KIPO), the contents of which are herein incorporated by reference in their entirety.

BACKGROUND

Example embodiments relate to an apparatus and a method of attaching a pad on an edge ring. More particularly, example embodiments relate to an apparatus and a method of attaching a pad on an edge ring which is used within a plasma chamber.

In a wafer processing system such as semiconductor etching equipment, an edge ring may be used to focus plasma onto a wafer and prevent polymer from being adhered onto the wafer. Because the edge ring is a consumable part which is damaged due to ion bombardment from plasma, the damaged edge ring may need to be replaced promptly. When the edge ring is replaced, a cooling pad may be attached on a lower surface of the edge ring.

However, because the cooling pad is attached on the lower surface of the edge ring manually, an air bubble may be trapped between the edge ring and the cooling pad, thereby reducing a cooling effect of the cooling pad and causing a failure in the equipment.

SUMMARY

Example embodiments provide an apparatus for attaching a pad on an edge ring without leaving air bubbles between the pad and the edge ring.

Example embodiments provide a method of attaching a pad on an edge ring without leaving air bubbles between the pad and the edge ring.

According to example embodiments, an apparatus for attaching a pad on or to an edge ring includes a chamber defining a space for attaching a pad on or to an edge ring, a pad support within the chamber and supporting the pad thereon, an edge ring support within the chamber and facing the pad support, the edge ring support securing the edge ring thereon, a driving module or system connected to at least one of the pad support and the edge ring support and configured to move the edge ring support relative to the pad support, and a vacuum exhaust portion or system configured to create a vacuum atmosphere within the chamber.

According to example embodiments, an apparatus for attaching a pad on or to an edge ring includes a chamber defining a space for attaching a pad on or to an edge ring, a pad support within the chamber and on which the pad is disposed, a driving module or system within the chamber, the driving system including a support plate, a drive shaft connected to the support plate and a driving portion configured to move the drive shaft upward and downward, an edge ring support mountable on the support plate to face the pad support, the edge ring support securing the edge ring thereon, and a vacuum exhaust portion or system configured to create a vacuum atmosphere within the chamber.

According to example embodiments, in a method of attaching a pad on or to an edge ring, a pad support having a pad thereon is loaded into a chamber. An edge ring support having an edge ring secured thereto is loaded onto a support plate, the support plate being movable upward and downward within the chamber. A vacuum atmosphere is created within the chamber. The support plate is moved upward and/or downward to attach the pad on the edge ring.

According to example embodiments, after a pad support having a cooling pad disposed thereon and an edge ring support having an edge ring secured thereto are loaded into a chamber, a vacuum atmosphere may be created within the chamber, and then, the edge ring support may be moved relative to the pad support to attach the cooling pad on or to a lower surface of the edge ring Accordingly, under the vacuum atmosphere an air bubble may be prevented from being trapped in the cooling pad when the cooling pad is attached on or to the edge ring.

BRIEF DESCRIPTION OF THE DRAWINGS

Example embodiments will be more clearly understood from the following detailed description taken in conjunction with the accompanying drawings.

FIG. 1 is a block diagram illustrating a substrate processing apparatus in accordance with example embodiments.

FIG. 2 is a cross-sectional view illustrating a portion of a substrate stage in FIG. 1.

FIG. 3 is a bottom view illustrating a cooling pad attached on or to a lower surface of an edge ring in FIG. 2.

FIG. 4 is a cross-sectional view illustrating a pad attaching apparatus for an edge ring in accordance with example embodiments.

FIG. 5 is a perspective view illustrating a portion of the pad attaching apparatus in FIG. 4.

FIG. 6 is a plan view illustrating a pad support of the pad attaching apparatus in FIG. 4.

FIG. 7 is a perspective view illustrating the portion "A" of FIG. 6.

FIG. 8 is a plan view illustrating the cooling pad disposed on the pad support in FIG. 6.

FIG. 9 is a perspective view illustrating an edge ring support of the pad attaching apparatus in FIG. 4.

FIGS. 10 to 19 are views illustrating a pad attaching method for an edge ring in accordance with example embodiments.

FIG. 20 is a cross-sectional view illustrating a pad attaching apparatus for an edge ring in accordance with example embodiments.

FIG. 21 is a perspective view illustrating a portion of the pad attaching apparatus in FIG. 20.

FIG. 22 is a flow chart illustrating a plasma processing method in accordance with example embodiments.

DETAILED DESCRIPTION OF EXAMPLE EMBODIMENTS

Hereinafter, example embodiments will be explained in detail with reference to the accompanying drawings. As used herein the expression "and/or" includes any and all combinations of one or more of the associated listed items.

Figure 1:
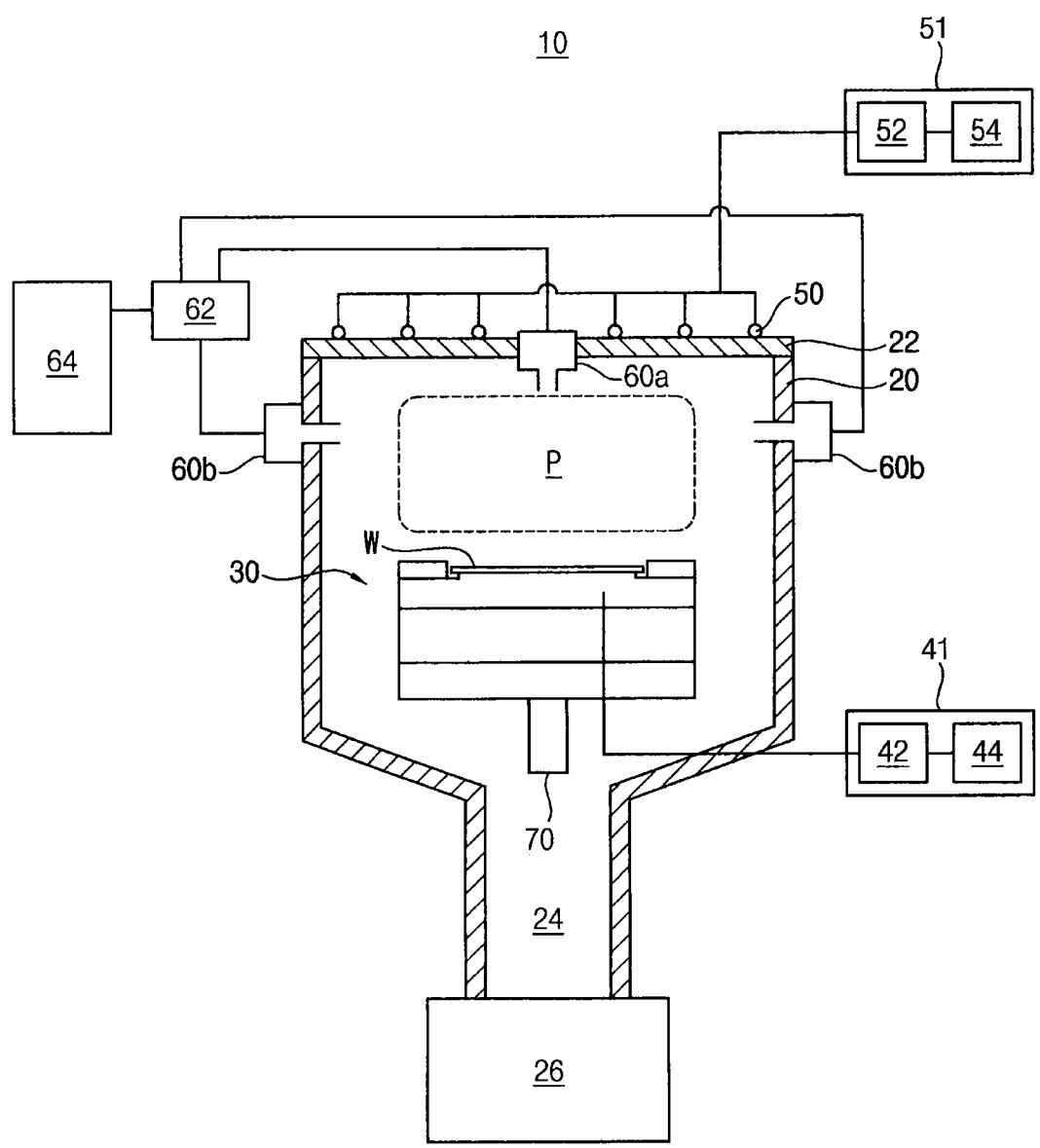
FIGS. 1 to 22 represent non-limiting, example embodiments as described herein.
Figure 2:
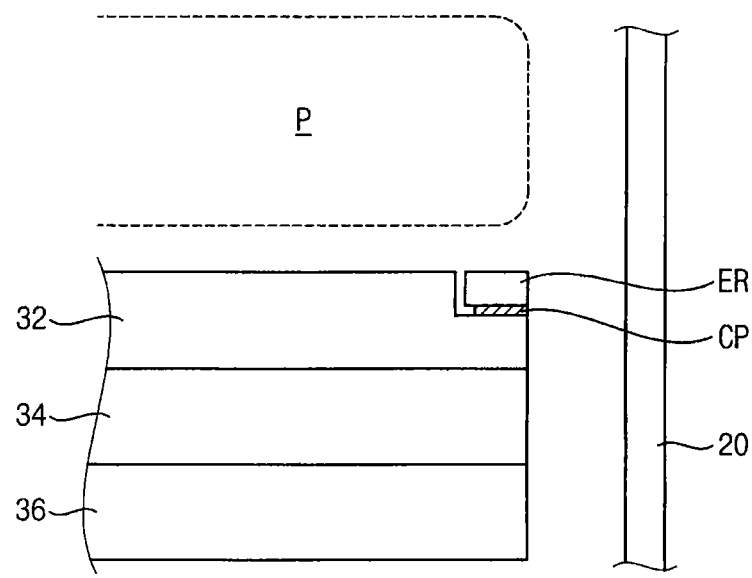
Figure 3:
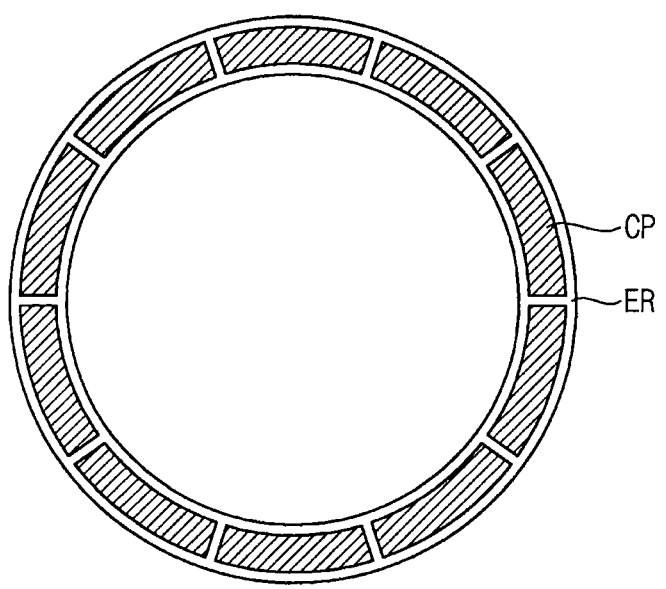

FIG. 1 is a block diagram illustrating a substrate processing apparatus in accordance with example embodiments. FIG. 2 is a cross-sectional view illustrating a portion of a substrate stage in FIG. 1. FIG. 3 is a bottom view illustrating a cooling pad attached on or to a lower surface of an edge ring in FIG. 2.

Referring to FIGS. 1 to 3, a substrate processing apparatus 10 may include a process chamber 20, a substrate support 30, a plasma generation portion or system and a gas supply portion or system. Additionally, the substrate processing apparatus 10 may further include a gas exhaust portion or system 26. The substrate support 30 may include a substrate stage on which a substrate is supported, and an edge ring ER on the substrate stage to surround the substrate.

In example embodiments, the substrate processing apparatus 10 may be an apparatus configured to etch a layer on the substrate such as a wafer W disposed within the induced coupled plasma (ICP) chamber 20. However, the plasma generated by the substrate processing apparatus may not be limited to the inductively coupled plasma, and, for example, capacitively coupled plasma, microwave plasma, etc, may be generated by the substrate processing apparatus. Additionally, the substrate processing apparatus may not be limited to the etching apparatus and, for example, the substrate process apparatus may be used as a deposition apparatus, a cleaning apparatus, etc. Here, the substrate may include a semiconductor substrate, a glass substrate, etc.

The process chamber 20 may provide a sealed space where a plasma etch process is performed on the wafer W. The process chamber 20 may be a cylindrical shaped vacuum chamber. The process chamber 20 may include a metal such as aluminum, stainless steel, etc. The process chamber 20 may include a cover 22 which covers an open upper end portion of the process chamber 20. The cover 22 may airtightly seal the upper end portion of the process chamber 20.

A gate for opening and closing a loading/unloading port of the wafer W may be provided in a sidewall of the process chamber 20. The wafer W may be loaded onto or unloaded from the substrate stage through the gate.

A gas exhaust port 24 may be provided in a bottom portion of the process chamber 20, and the gas exhaust portion 26 may be connected to the gas exhaust port 24 through a gas exhaust line. The gas exhaust portion 26 may include a vacuum pump, such as a turbo-molecular pump or the like, to control a pressure of the process chamber 20 so that the processing space inside the process chamber 20 may be depressurized to a desired vacuum level. Additionally, process by-products and residual process gases may be discharged from the process chamber 20 through the gas exhaust port 24.

The plasma generation portion may include a lower electrode 32, an upper electrode 50, a first power supply 51 to apply a plasma source power to the upper electrode 50, and a second power supply 41 to apply a bias source power to the lower electrode 32.

The upper electrode 50 may be disposed outside the process chamber 20 such that the upper electrode 50 faces the lower electrode 32. The upper electrode 50 may be disposed on the cover 22. The upper electrode 50 may include a radio frequency antenna. The radio frequency antenna may have a plan coil shape. The cover 22 may include a circular plate shaped dielectric window. The dielectric window may include a dielectric material. For example, the dielectric window may include alumina ($Al_2O_3$). A power from the antenna may be transferred into the process chamber 20 through the dielectric window.

For example, the upper electrode 50 may include coils having a spiral shape or a concentric shape. The coil may generate inductively coupled plasma P in a space of the process chamber 20. Herein, the coils may be described exemplarily, however, it may be understood that the number, arrangement, etc of the coils may not be limited thereto.

The first power supply 51 may include a source RF power source 54 and a source RF matcher 52, such as plasma source elements. The source RF power source 54 may generate a radio frequency (RF) signal. The source RF matcher 52 may match impedance of the RF signal generated by the source RF power source 54 using the coils to control generation of plasma.

The second power supply 41 may apply the bias source power to the lower electrode 32. For example, the second power supply 41 may include a bias RF power source 44 and a bias RF matcher 42, such as bias elements. The lower electrode 32 may attract plasma atoms or ions generated within the process chamber 20. The bias RF power source 44 may generate a radio frequency (RF) signal. The bias RF matcher 42 may match impedance of the bias RF signal by controlling bias voltage and bias current applied to the lower electrode 32. The bias RF power source 44 and the source RF power source 54 may be synchronized or desynchronized to each other through a synchronizer of a controller.

The controller may be connected to the first power supply 51 and the second power supply 41 and control operations thereof. The controller having a microcomputer and various interface circuits may control an operation of the substrate processing apparatus based on programs and recipe information stored in an external or internal memory.

The gas supply portion may include gas supply lines 60a, 60b, a flow controller 62 and a gas supply source 64, such as gas supply elements. The gas supply lines 60a, 60b may be connected to an upper portion and/or a side portion of the process chamber 20 to supply the gases into the process chamber 20 therethrough. For example, the gas supply lines may include a vertical gas supply line 60a which penetrates through the cover 22 and a horizontal gas supply line 60b which penetrates through the sidewall of the process chamber 20. Various gases may be supplied into the plasma space of the process chamber 20 through the vertical gas supply line 60a and the horizontal gas supply line 60b.

The gas supply portion may supply different gases having a desired mixture ratio. The gas supply source 64 may store a plurality of the gases, and the gases may be supplied through a plurality of gas lines connected to the gas supply lines 60a, 60b respectively. The flow controller 62 may control an amount of the gases supplied into the process chamber 20 through the gas supply lines 60a, 60b. The flow controller 62 may control independently or commonly the supply amounts of the gases supplied to the vertical gas supply line 60a and the horizontal gas supply line 60b, respectively. For example, the gas supply source 64 may include a plurality of gas tanks, and the flow controller 62 may include a plurality of mass flow controllers (MFCs) corresponding to the gas tanks. The mass flow controllers may control independently the supply amounts of the gases respectively.

In example embodiments, the substrate support 30 may be disposed within the process chamber 20 to support the wafer W. The substrate support 30 may include the substrate stage to support the wafer W and the edge ring ER arranged in an outer upper surface of the substrate stage.

In particular, the substrate stage may include the lower electrode 32, an insulation plate 34, and a lower ground plate 36.

The lower electrode 32 may be an electrode plate having a circular plate. The lower electrode 32 may include an electrostatic chuck for holding the wafer W using electrostatic force. The wafer W may be adsorptively held on the electrostatic chuck when a direct current is applied thereto by a DC power source (not illustrated).

The lower electrode 32 may have a diameter greater than a diameter of the wafer W. Additionally, the lower electrode 32 may have a cooling channel therein. In order to increase a control accuracy of a wafer temperature, a heat transfer gas such as a He gas may be supplied to a gap between the electrostatic chuck and the wafer W. The lower electrode 32 may be installed to be movable upwardly and downwardly by a driving support portion 70.

The insulation plate 34 may be arranged between the lower electrode 32 and the lower ground plate 36 to electrically insulate therebetween. The insulation plate 34 may be positioned under the lower electrode 32.

The lower ground plate 36 may be positioned in a lower portion of the substrate stage. The lower ground plate 36 may have a space with an open upper end. The open upper end of the lower ground plate 36 may be covered with the insulation plate 34.

Although it is not illustrated in the figures, the substrate stage may further include a side insulation ring which is arranged to cover an outer surface of the lower electrode 32. The side insulation ring may serve as a cover ring for protecting the outer surface of the lower electrode 32.

The edge ring ER may be arranged on the outer upper surface of the lower electrode 32 to surround the wafer. The edge ring ER may serve as a focus ring for precisely securing the wafer and focusing plasma onto the wafer.

As illustrated in FIG. 3, a cooling pad CP may be attached on or to a lower surface of the edge ring ER. The edge ring heated during a plasma etch process may be cooled through the cooling pad CP. The edge ring ER may be seated on the substrate stage with the cooling pad CP interposed therebetween. The cooling pad CP may include a plurality of pad pieces. The pad pieces may be arranged along an extending or circumferential direction of the edge ring ER to be spaced apart from each other.

For example, the edge ring ER may include silicon (Si) or silicon carbide (SiC). The cooling pad CP may include silicon, and may include a filler having high thermal conductivity. The cooling pad CP may have an adhesive force, and thus, may be pressed and then adhered on or to the lower surface of the edge ring ER.

Hereinafter, an apparatus and a method of attaching a cooling pad on the edge ring will be explained.

Figure 4:
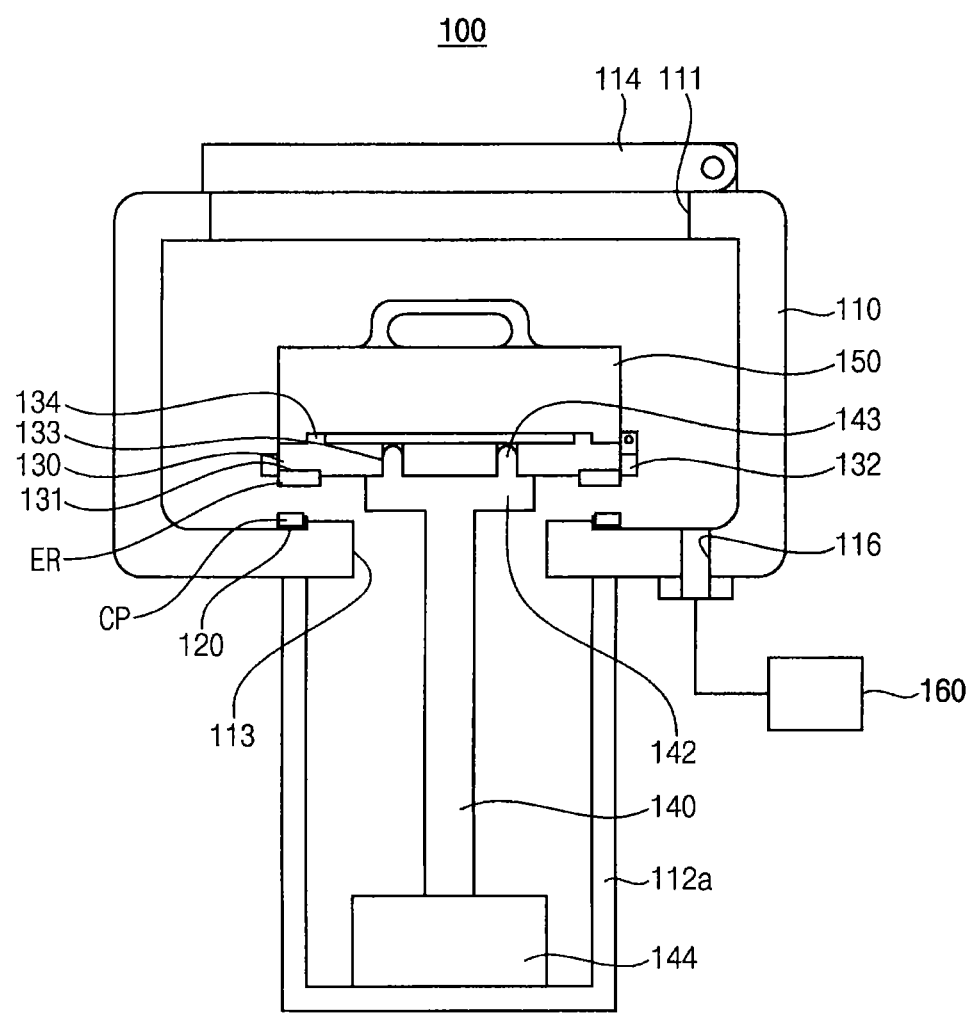
Figure 5:
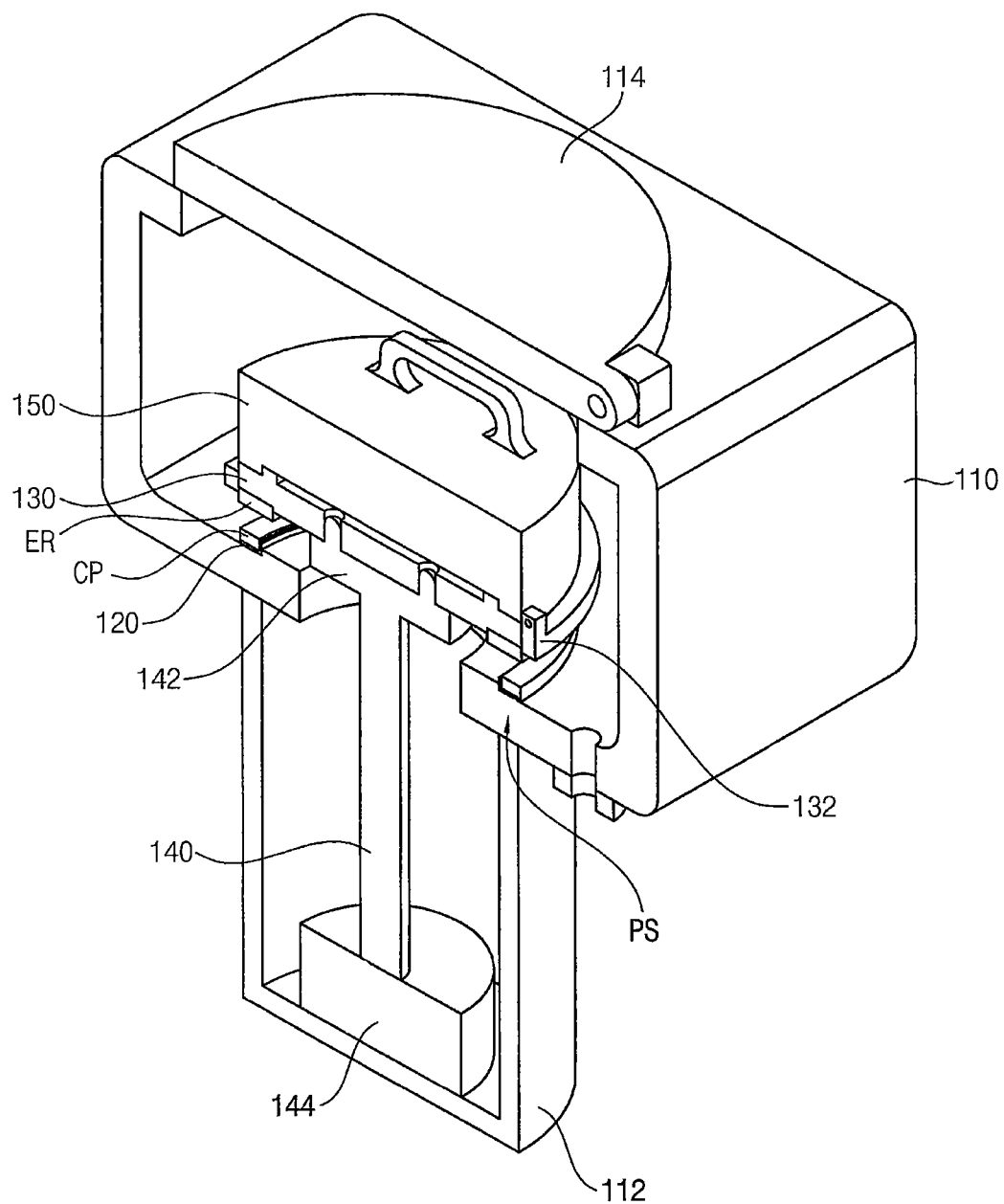
Figure 6:
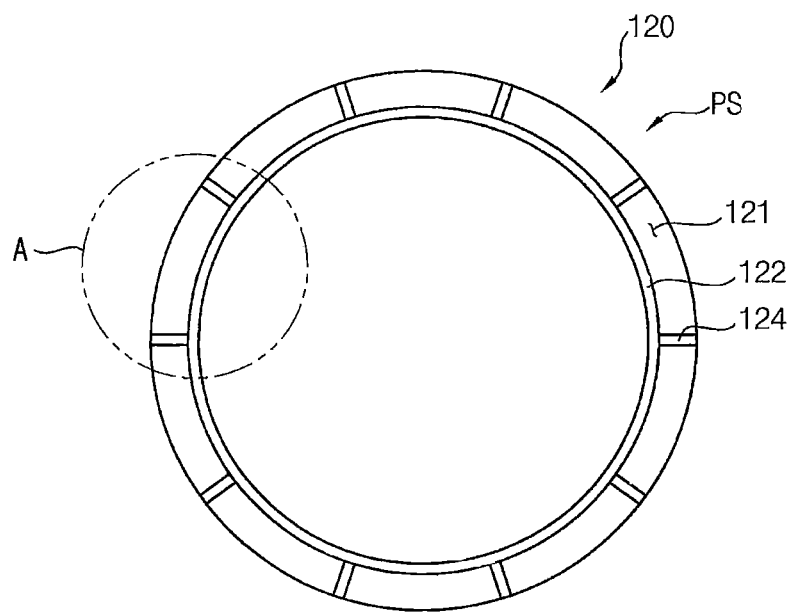
Figure 7:
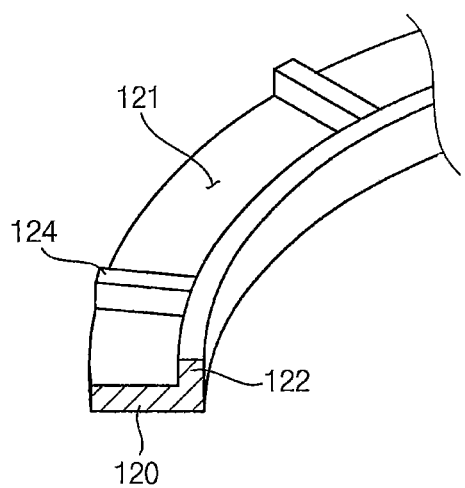
Figure 8:
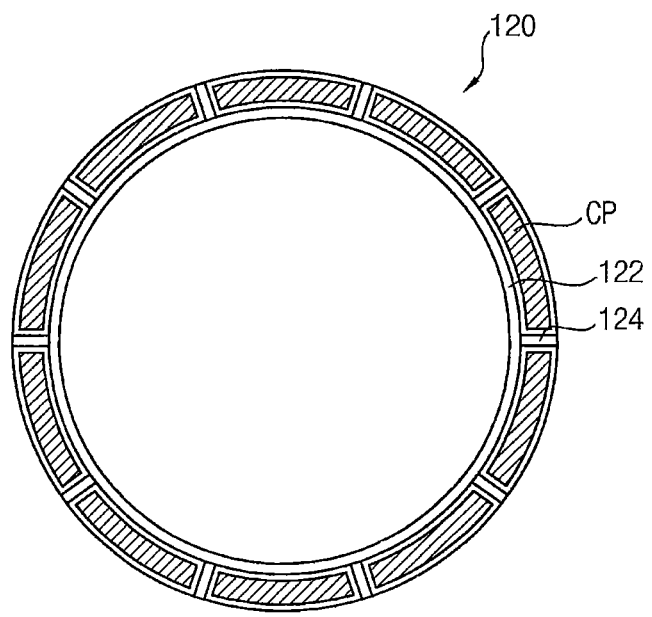
Figure 9:
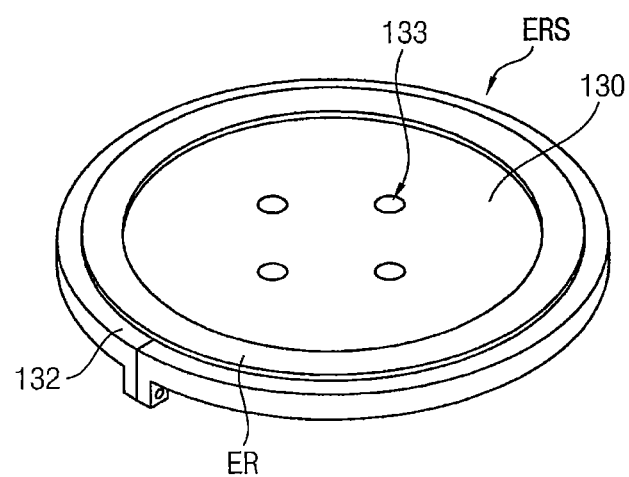

FIG. 4 is a cross-sectional view illustrating a pad attaching apparatus for an edge ring in accordance with example embodiments. FIG. 5 is a perspective view illustrating a portion of the pad attaching apparatus in FIG. 4. FIG. 6 is a plan view illustrating a pad support of the pad attaching apparatus in FIG. 4. FIG. 7 is a perspective view illustrating the portion "A" of FIG. 6. FIG. 8 is a plan view illustrating the cooling pad disposed on the pad support in FIG. 6. FIG. 9 is a perspective view illustrating an edge ring support of the pad attaching apparatus in FIG. 4.

Referring to FIGS. 4 to 9, a pad attaching apparatus for an edge ring 100 may include a chamber 110 to provide a space for attaching a cooling pad CP on an edge ring ER, a pad support PS configured to support the cooling pad CP, an edge ring support ERS configured to support the edge ring ER to face the cooling pad CP on the pad support, a driving module or system configured to move the edge ring support relative to the pad support, and a vacuum exhaust portion or system 160 configured to create a vacuum atmosphere within the chamber 110.

In example embodiments, the pad attaching apparatus for an edge ring 100 may be an apparatus for attaching the cooling pad CP on a lower surface of the edge ring ER under a vacuum atmosphere. For example, the edge ring ER may have a diameter of about 300 mm to about 350 mm. The cooling pad CP may include a plurality of pad pieces which are arranged on the lower surface of the edge ring ER along an extending or circumferential direction of the edge ring ER to be spaced apart from each other. A dimension of the pad piece, the number of the pad pieces, etc. may be determined in consideration of heat transfer coefficient, a change in temperature of the edge ring in the plasma process, etc. Alternately, the cooling pad CP may be an annular-shaped or ring-shaped (e.g., continuous) pad attached on the lower surface of the edge ring ER.

As illustrated in FIGS. 4 and 5, the chamber 110 may have an overall square or rectangular pillar shape. Alternatively, the chamber 110 may have a cylindrical shape. The chamber 110 may have a bottom wall, a top wall and sidewalls defining the inner space.

A gate 111 through which the pad support and the edge ring support are loaded and unloaded may be formed in the top wall. The pad support having the cooling pad CP disposed thereon and the edge ring support having the edge ring ER secured thereon may be loaded into or unloaded from the chamber 110 through the gate 111. The chamber 110 may include a cover 114 which covers the gate 111. The cover 114 may airtightly seal the gate 111.

An exhaust port 116 may be installed in the bottom wall of the chamber 110. The vacuum exhaust portion 160 may include a pump which is connected to the exhaust port 116 through an exhaust line. The pump may include an air pump to control a pressure of the chamber 110 so that the inner space of the chamber 110 may be depressurized to a desired vacuum level.

Alternatively, the chamber may include a lower chamber and an upper chamber. The lower chamber and the upper chamber may be engaged with each other to form an airtight space therebetween. In this case, the lower chamber and the upper chamber may be installed to move relative each other. For example, the upper chamber may be supported to be movable along a vertical rail extending in a vertical direction by a linear motor. The upper chamber may move upward by the linear motor to open the chamber and may move downward to engage with the lower chamber to close the chamber. Alternatively, the upper chamber may be movable to open or close the chamber through a connection linkage connected to the lower chamber.

The pad support may be installed in or on the bottom wall of the chamber 110. For example, the pad support may be detachably installed on the bottom wall of the chamber 110. The pad support may be loaded into or unloaded from the chamber 110 through the gate 111.

As illustrated in FIGS. 6 to 8, the pad support PS may include a first plate 120 to support the cooling pad CP. A plurality of the pad pieces may be arranged along an extending direction of the first plate 120 to be spaced apart from each other. The pad pieces of the cooling pad CP may be disposed on a seating surface 121 of the first plate 120.

The pad support may further include a first guide or guiding protrusion or wall 122 which is formed to protrude from an inner upper surface of the first plate 120. A height of the first guiding protrusion 122 may be less than a height of the pad piece on the seating surface of the first plate 120. The first guiding protrusion 122 may extend along the extending or circumferential direction of the first plate 120 to have an annular or ring shape, thereby aligning positions of the pad pieces of the cooling pad CP.

The pad support may further include second guide or guiding protrusions or walls 124 (also referred to herein as guide partitions) positioned between the pad pieces in order to align the positions of the pad pieces. The second guiding protrusions 124 may be arranged along the extending or circumferential direction of the first plate 120 to be spaced apart from each other, defining the seating surfaces 121.

The edge ring support may be arranged within the chamber 110 to face the pad support. The edge ring support may be mounted on a support plate 142 of the driving module or system DS. For example, the edge ring support may be detachably installed in the support plate 142 of the driving module. The edge ring support may be loaded to or unloaded from the chamber 110 through the gate 111.

Figure 12:
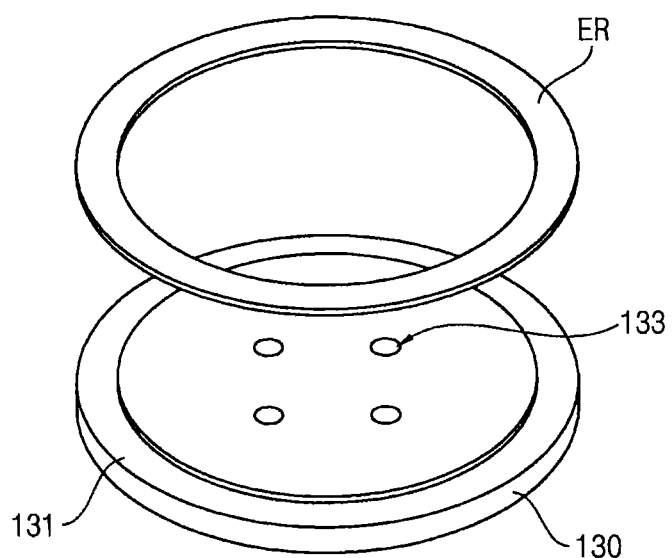
Figure 13:
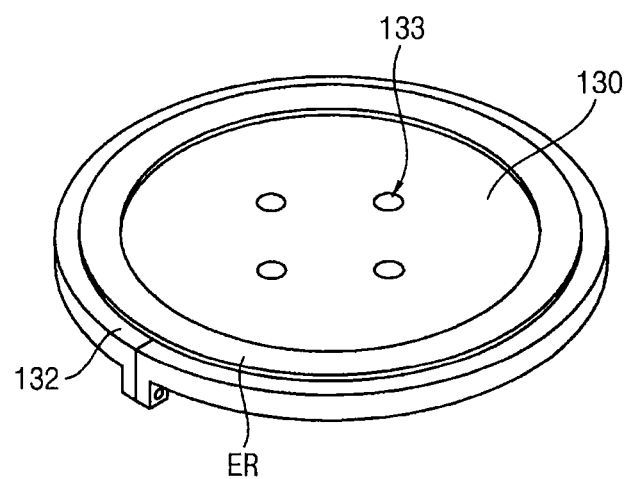
Figure 14:
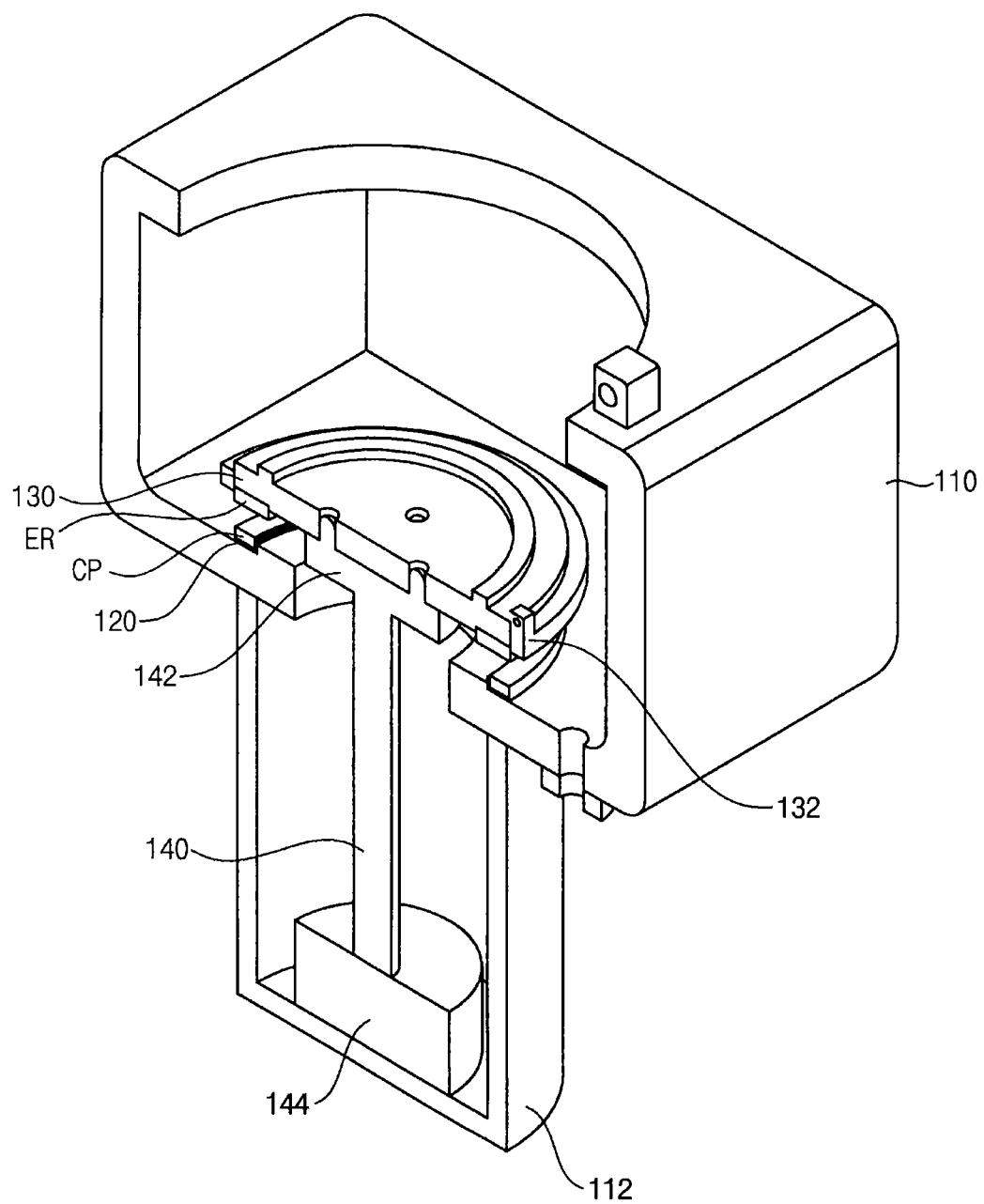
Figure 15:
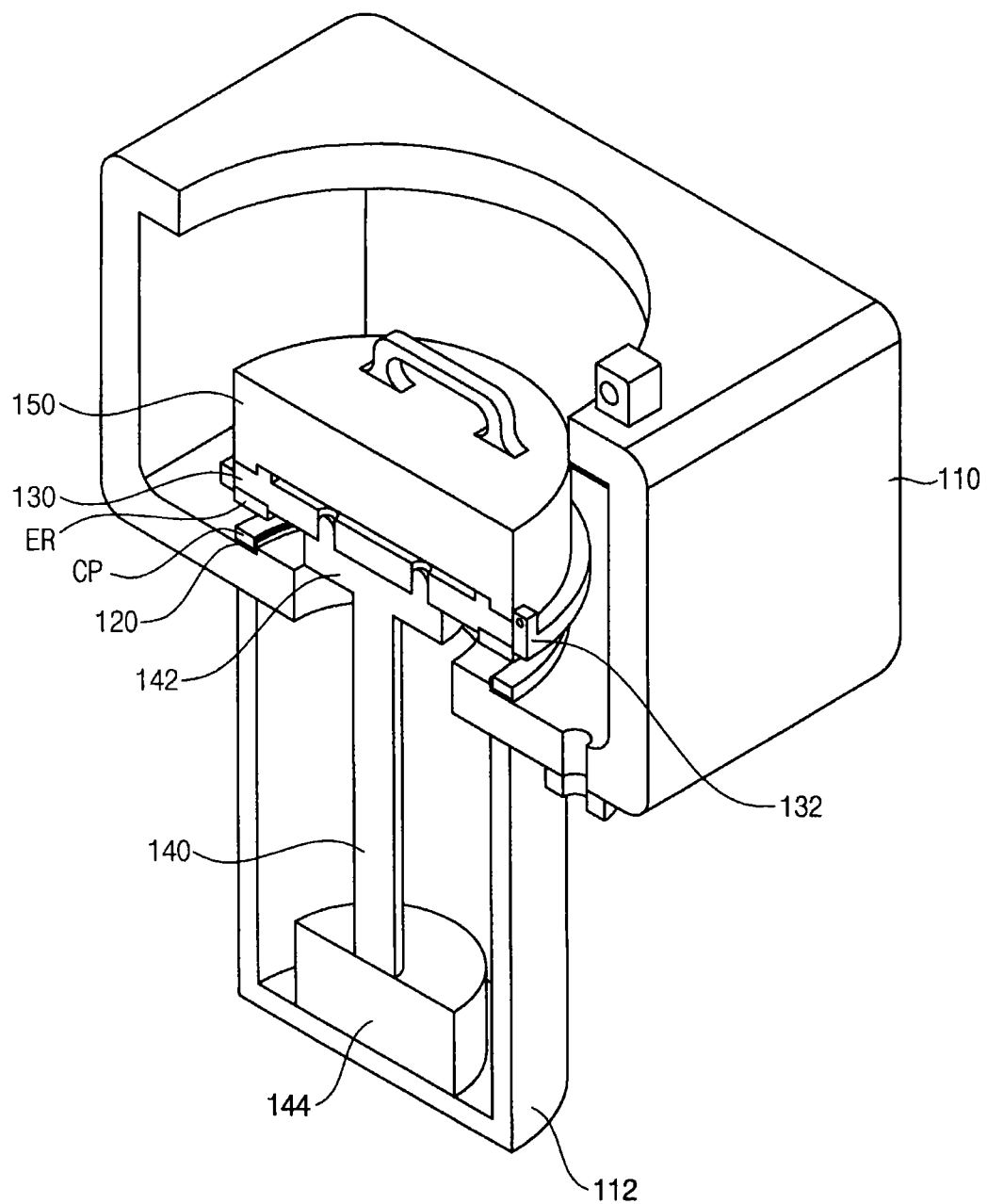
Figure 16:
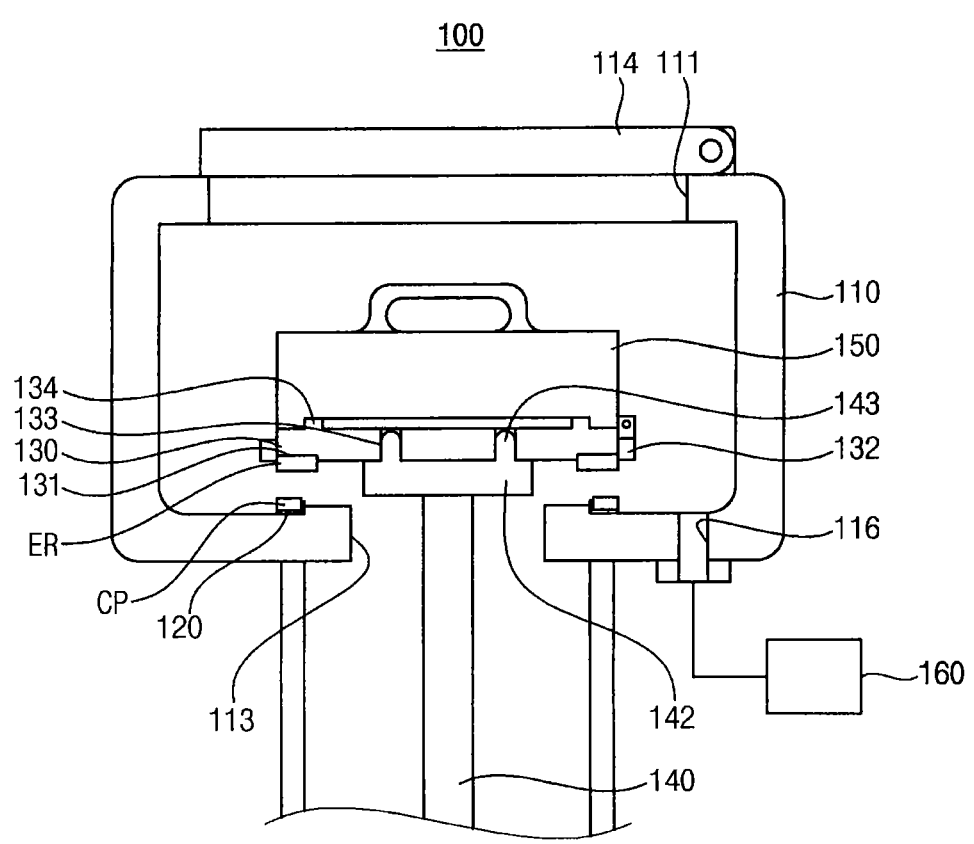
Figure 17:
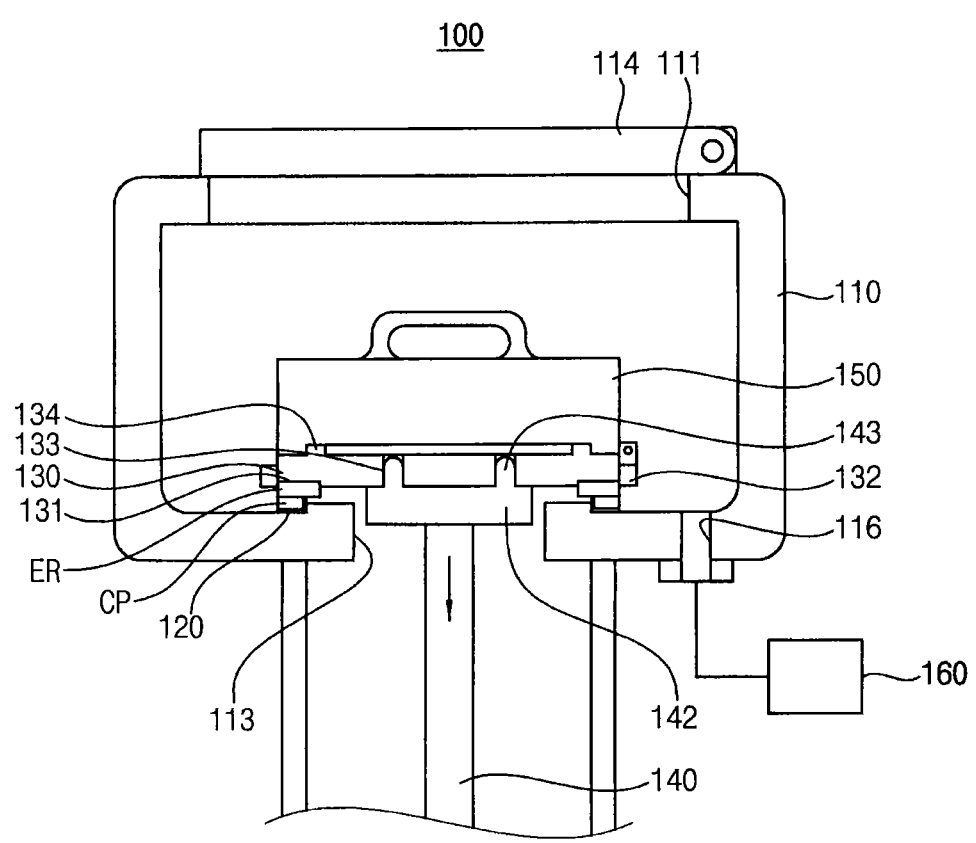
Figure 18:
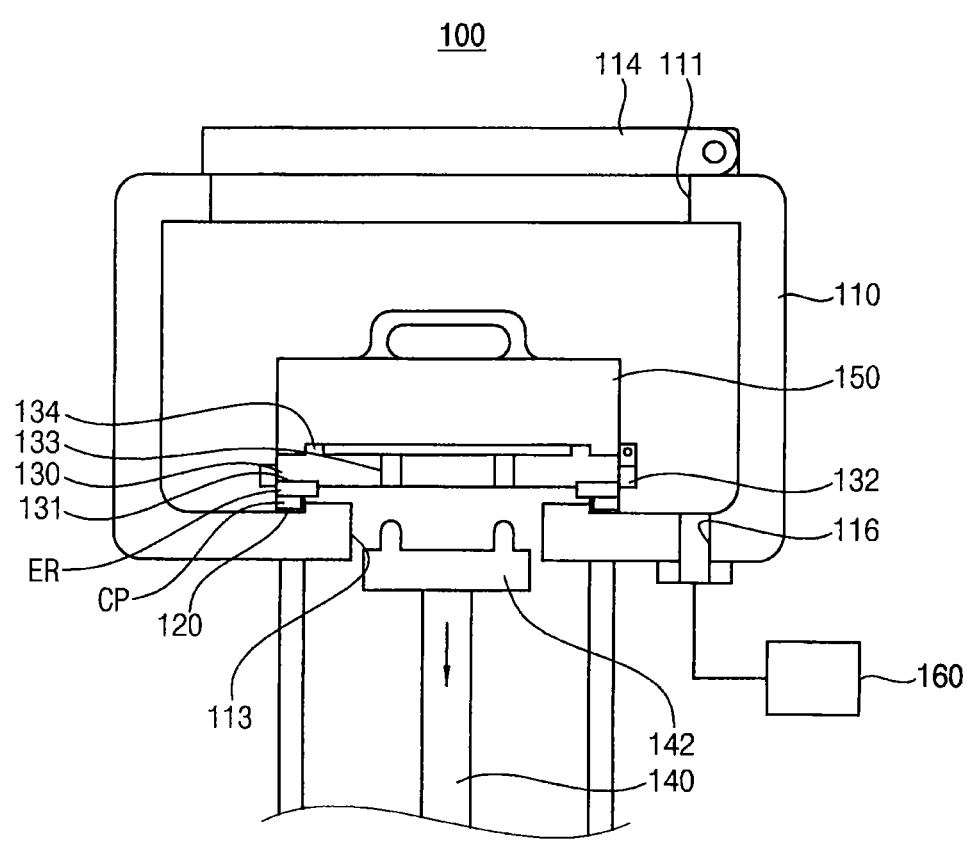
Figure 19:
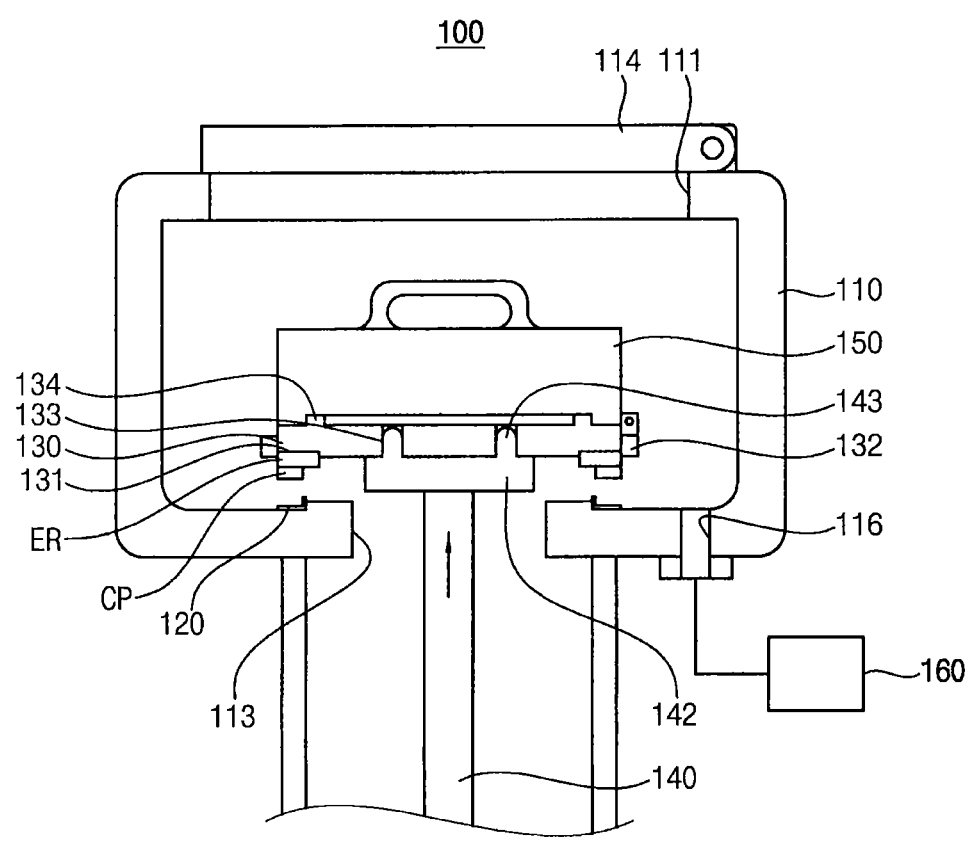

As illustrated in FIG. 9, the edge ring support ERS may include a second plate 130 to support the edge ring ER. An annular-shaped or ring-shaped recess 131 (see FIG. 12) in which the edge ring ER is seated may be formed or defined in a lower surface of the second plate 130. Accordingly, the edge ring ER may be disposed in the recess 131 of the second plate 130.

The edge ring support may further include a clamping member 132 which is combined with the second plate 130 to secure the edge ring ER to the second plate 130. The clamping member 132 may include at least one clamping extension which is arranged around the second plate 130. Both end portions of the clamping extension may be combined with or connected to each other by a fastening member such as a fastening bolt to secure the edge ring ER to the second plate 130. The edge ring ER secured in the recess 131 of the second plate 130 may protrude from the clamping member 132. As described below, the pad pieces of the cooling pad CP may be attached on or to the protruding lower surface of the edge ring ER.

The driving module may be connected to at least one of the pad support and the edge ring support to move the edge ring support relative to the pad support. The driving module may include a support plate 142 within the chamber 110, a drive shaft 140 connected to the support plate 142 and a driving portion 144 to move the drive shaft 140 upward and downward.

In example embodiments, the support plate 142 may support the lower surface of the second plate 130. An upper surface of the support plate 142 may have a diameter less than an inner diameter of the edge ring ER. The edge ring ER may be fixed on the lower surface of the second plate 130, and the edge ring ER may be exposed from or spaced apart from the support plate 142.

Aligning pins 143 may be provided on the upper surface of the support plate 142, and aligning holes 133 may be provided in or defined in the lower surface of the second plate 130. When the second plate 130 is seated on the support plate 142, the aligning pins 143 may be inserted into the aligning holes 133 to align a position of the second plate 130.

The support plate 142 may be movable upwardly and downwardly through an inner space or opening of the annular-shaped or ring-shaped first plate 120. The chamber 110 may include a lower chamber 112a which extends in a downward direction from a middle region of the bottom wall. The driving portion 144 may be installed in a bottom wall of the lower chamber 112a. The driving portion 144 may elevate the drive shaft 140 connected to the support plate 142. For example, the driving portion 144 may include a pneumatic cylinder, a driving motor, etc. As the driving portion 144 elevates the support plate 142 through the drive shaft 140, the second plate 130 of the edge ring support may move relative to the first plate 120 of the pad support.

In example embodiments, the pad attaching apparatus for an edge ring 100 may further include a pressurizing member 150 which is disposed on the second plate 130 of the edge ring support to press the second plate 130 against the first plate 120 of the pad support.

The pressurizing member 150 may be detachably installed on the second plate 130 of the edge ring support. The pressurizing member 150 may be loaded into or unloaded from the chamber 110 through the gate 111. The pressurizing member 150 may be loaded into the chamber 110 and may disposed on the second plate 130 of the edge ring support such that the edge ring ER secured on the lower surface of the second plate 130 is pressed against the cooling pad CP supported on the upper surface of the first plate 120.

Hereinafter, a method of attaching a cooling pad on an edge ring using the pad attaching apparatus for an edge ring in FIG. 4 will be explained.

FIGS. 10 to 19 are views illustrating a pad attaching method for an edge ring in accordance with example embodiments.

Figure 10:
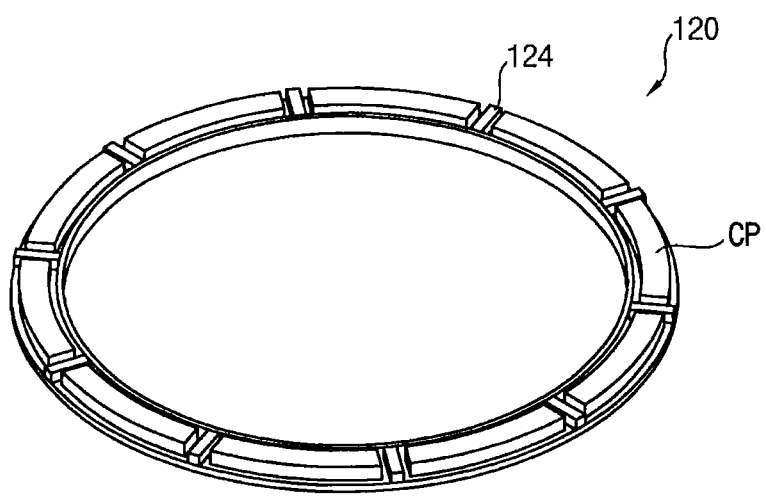
Figure 11:
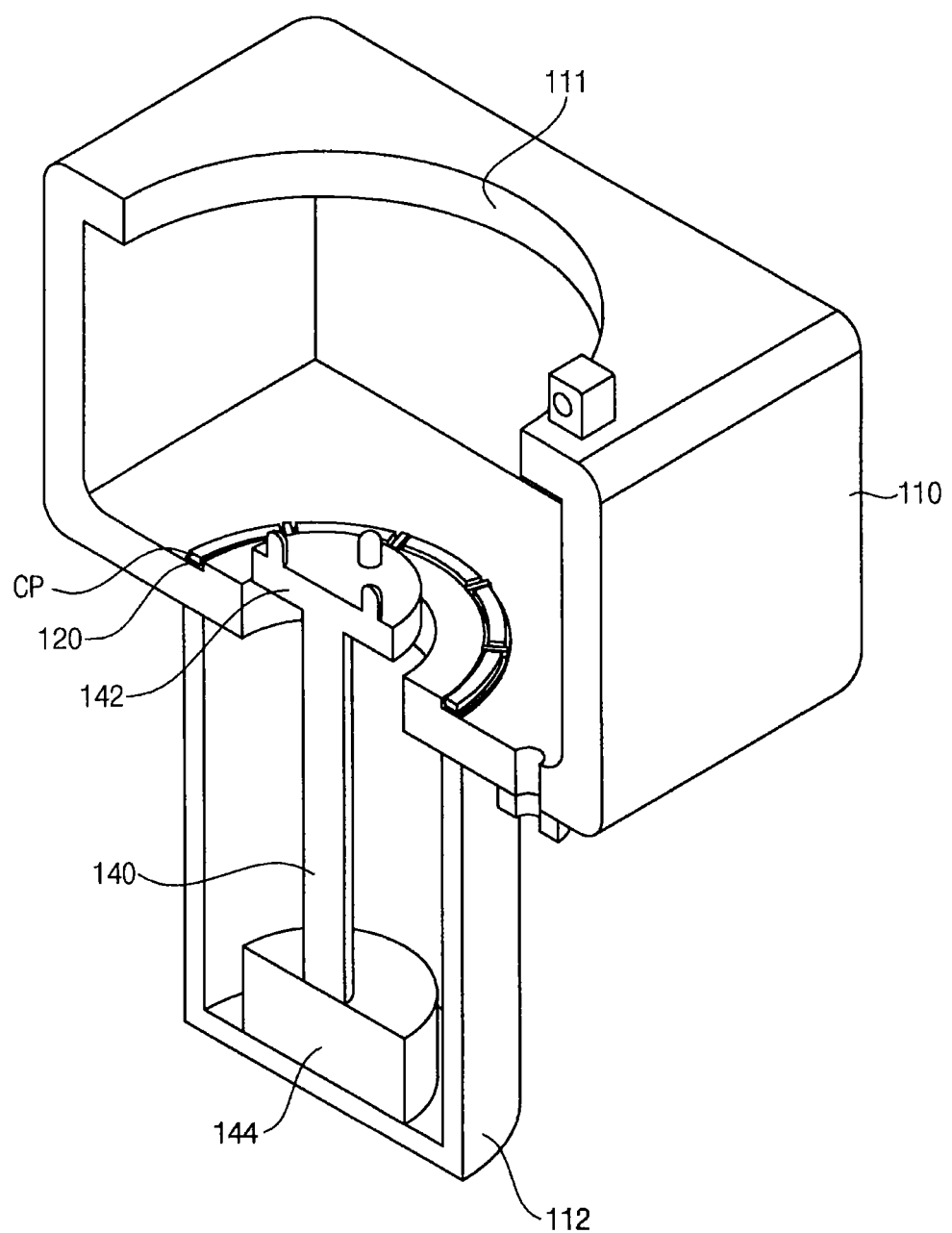

Referring to FIGS. 10 and 11, a pad support having a cooling pad CP thereon may be loaded into a chamber 110.

In example embodiments, first, the cooling pad CP may be disposed on the pad support. A plurality of pad pieces of the cooling pad CP may be arranged on a seating surface of the a first plate 120 in an extending or circumferential direction of the first plate 120 to be spaced apart from each other. The cooling pad CP may be a pad having an adhesive force or adhesive. The cooling pad CP may include silicon, and may include a filler having high thermal conductivity.

Then, the pad support having the cooling pad CP disposed thereon may be loaded into the chamber 110. The first plate 120 may be disposed on a bottom wall of the chamber 110. For example, the first plate 120 of the pad support may be detachably installed on the bottom wall of the chamber 110. Alternatively, the first plate 120 may be fixedly installed on the bottom wall of the chamber 110. In this case, the cooling pad CP may be disposed directly on the first plate 120 within the chamber 110.

Referring to FIGS. 12 to 15, after an edge ring support having an edge ring ER secured thereto is loaded into the chamber 110, a pressurizing member 150 may be loaded into the chamber.

In example embodiments, the edge ring ER may be secured on the edge ring support. After the edge ring ER is seated in an annular-shaped recess 131 of a second plate 130, a clamping member 132 may be combined with or connected to an outer surface of the second plate 130 to press and secure the edge ring ER.

Then, after the edge ring support having the edge ring ER secured thereto is loaded into the chamber 110, the pressurizing member 150 may be loaded onto the edge ring support. The edge ring support may be supported fixedly on a support plate 142 within the chamber 110. For example, after the second plate 130 of the edge ring support is seated on the support plate 142, the pressurizing member 150 may be disposed on the support plate 142. When the second plate 130 is seated on the support plate 142, aligning pins 143 may be inserted into the aligning holes 133 to align a position of the second plate 130 (FIG. 4). Accordingly, the second plate 130 may be secured on the support plate 142 such that the edge ring ER may be aligned with and face the cooling pad CP.

Referring to FIGS. 16 to 19, after a vacuum atmosphere is created within the chamber 110, the cooling pad CP may be attached on or to a lower surface of the edge ring ER.

In example embodiments, an air pump may control a pressure of the chamber 110 so that an inner space of the chamber 110 may be depressurized to a desired vacuum level. As the chamber is maintained under the vacuum atmosphere, an air bubble may be prevented from being trapped between the edge ring ER and the cooling pad CP when the cooling pad CP is attached on or to the edge ring ER.

Then, after the support plate 142 is lowered to attach the cooling pad CP on or to the lower surface of the edge ring ER, the support plate 142 may be raised to separate the cooling pad CP from the first plate 120 of the pad support.

As a driving portion 144 lowers the support plate 142 through a drive shaft 140, the second plate 130 may move toward the first plate 120 such that the edge ring ER contacts the cooling pad CP. Then, as the support plate 142 continues to be lowered, the support plate 142 may be separated from the second plate 130 and the pressurizing member 150 may press the second plate 130 against the first plate 120 due to gravity of the pressurizing member 150. Thus, the cooling pad CP may be pressurized or compressed on the lower surface of the edge ring ER.

Then, as the driving portion 144 raises the support plate 142 through the drive shaft 140, the support plate 142 may move toward and contact the second plate 130. Then, as the support plate 142 continues to be raised, the edge ring ER having the cooling pad CP attached thereto may be lifted from the first plate 120.

Then, after an atmospheric pressure is introduced to the chamber 110, the edge ring ER having the cooling pad CP attached thereto may be unloaded from the chamber 110.

Figure 20:
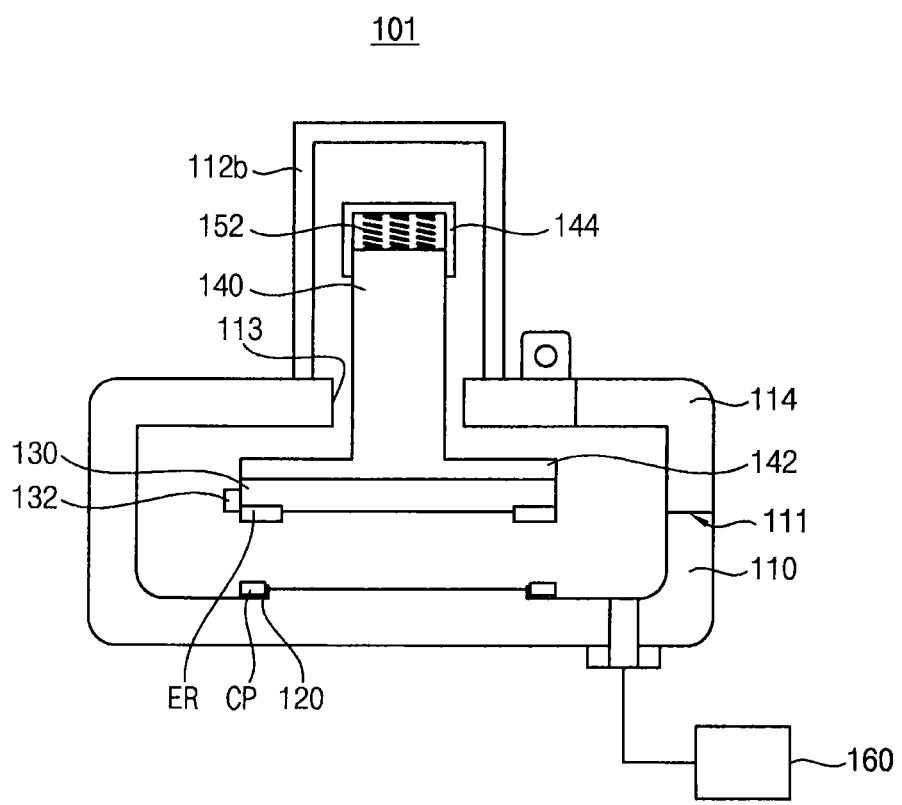
Figure 21:
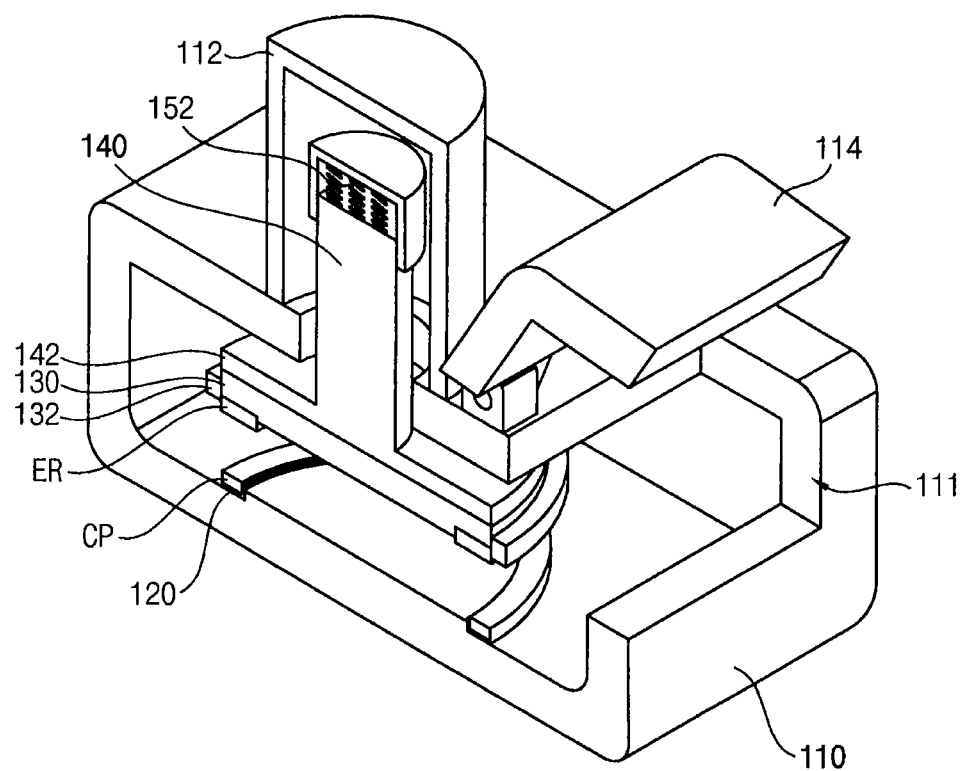

FIG. 20 is a cross-sectional view illustrating a pad attaching apparatus for an edge ring in accordance with example embodiments. FIG. 21 is a perspective view illustrating a portion of the pad attaching apparatus in FIG. 20. The pad attaching apparatus for an edge ring may be substantially the same as or similar to the pad attaching apparatus for an edge ring as described above, except for a configuration of a driving module. Thus, the same reference numerals will be used to refer to the same or like elements and any further repetitive explanation concerning the above elements will be omitted in the interest of brevity.

Referring to FIGS. 20 and 21, a pad attaching apparatus for an edge ring 101 may include a driving module provided above a pad support to elevate an edge ring support. The driving module may include a support plate 142 within a chamber 110, a drive shaft 140 connected to the support plate 142 and a driving portion 144 to move the drive shaft 140 upward and downward.

In example embodiments, the chamber 110 may include an upper chamber 112b which extends in an upward direction from a middle region of a top wall of the chamber 110. The driving portion 144 may be installed in or at a top wall of the upper chamber 112b. The driving portion 144 may elevate and descend the drive shaft 140 connected to the support plate 142. For example, the driving portion 144 may include a pneumatic cylinder, a driving motor, etc.

As the driving portion 144 elevates or ascends the support plate 142 through the drive shaft 140, the second plate 130 of the edge ring support may move relative to the first plate 120 of the pad support. Accordingly, the support plate 142 may be installed to be movable upwardly and downwardly above a first plate 120 of the pad support.

In example embodiments, the pad attaching apparatus for an edge ring 101 may further include a pressurizing member 152 configured to press the second plate 130 against the first plate 120 of the pad support.

The pressurizing member 152 may include an elastic member such as an elastic spring to apply a pressure on the drive shaft 140. The pressurizing member 152 may press the drive shaft 140 downward such that an edge ring ER fixedly supported on a lower surface of the second plate 130 is attached to a cooling pad CP supported on an upper surface of the first plate 120.

As mentioned above, in the pad attaching apparatus and method for an edge ring, after the pad support having the cooling pad CP disposed thereon and the edge ring support having the edge ring ER secured thereto are loaded into the chamber 110, a vacuum atmosphere may be created within the chamber 110, and then, the edge ring support may be moved relative to the pad support to attach the cooling pad CP on or to the lower surface of the edge ring ER.

Accordingly, under the vacuum atmosphere an air bubble may be prevented from being formed when the cooling pad CP is attached on or to the edge ring ER.

Hereinafter, a method of processing a substrate using the pad attaching apparatus and method for an edge ring and the substrate processing apparatus in FIG. 1 will be explained.

Figure 22:
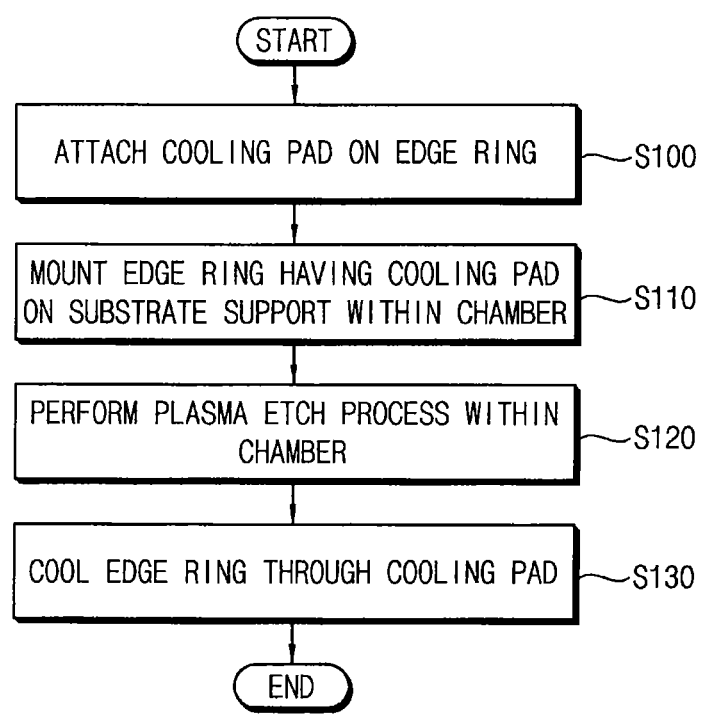

FIG. 22 is a flow chart illustrating a plasma processing method in accordance with example embodiments.

Referring to FIGS. 1, 4, 21 and 22, a cooling pad CP may be attached on an edge ring ER (S100), and then, the edge ring ER may be mounted on a substrate support within a process chamber 20 (S110).

In example embodiments, first, the cooling pad CP may be attached on a lower surface of the edge ring ER using the pad attaching apparatus 100, 101 in FIG. 4 or FIG. 21. After a pad support having the cooling pad CP disposed thereon and an edge ring support having the edge ring ER secured thereto are loaded into a chamber 110, a vacuum atmosphere may be created within the chamber 110, and then, the edge ring support may be moved relative to the pad support to attach the cooling pad CP on or to the lower surface of the edge ring ER.

Then, the edge ring ER may be mounted on a substrate stage within the process chamber 20. The edge ring ER may be arranged on an outer upper surface of a lower electrode 32 to surround a wafer. The edge ring ER may be seated on the substrate stage with the cooling pad CP interposed between.

A plasma etch process may be performed within the process chamber 20 (S120) and then during the plasma etch process the edge ring ER may be cooled through the cooling pad (S130).

In example embodiments, after a substrate W is loaded into the induced coupled plasma chamber 20, a process gas may be supplied on the substrate W and the plasma etch process may be performed.

First, the semiconductor wafer W may be loaded on an electrostatic chuck of the substrate stage within the process chamber 20. The process gas (for example, an etching gas) may be introduced into the process chamber 20 through gas supply lines 60a, 60b and then a pressure of the process chamber 20 may be controlled to a desired vacuum level by a gas exhaust portion 26. The etching gases may be supplied to the process chamber 20 through the gas supply lines 60a, 60b.

Then, a plasma power may be applied to an upper electrode 50 to generate plasma within the process chamber 20, and a bias power may be applied to a lower electrode 32 to perform the plasma etch process.

The edge ring ER may focus plasma onto the wafer and prevent polymer from being adhered onto the wafer. The edge ring ER heated during the plasma etch process may be cooled through the cooling pad CP. Since there are no air bubbles between the cooling pad CP and the edge ring ER, cooling efficiency for the edge ring ER may be improved. Accordingly, an etch rate in the plasma etch process may be improved.

The above substrate processing apparatus may be used to manufacture semiconductor devices including logic devices and memory devices. For example, the semiconductor device may be applied to logic devices such as central processing units (CPUs), main processing units (MPUs), or application processors (APs), or the like, and volatile memory devices such as DRAM devices, SRAM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present inventive concepts. Accordingly, all such modifications are intended to be included within the scope of example embodiments as defined in the claims.

What is claimed is:

1. An apparatus comprising:
   a chamber defining a space for attaching a pad to an edge ring;
   a pad support within the chamber and supporting the pad thereon;
   an edge ring support within the chamber and facing the pad support, the edge ring support securing the edge ring thereon;
   a driving system connected to at least one of the pad support and the edge ring support and configured to move the edge ring support relative to the pad support; and
   a vacuum exhaust system configured to create a vacuum atmosphere within the chamber,
   wherein the pad support comprises a first plate having an annular or ring shape to support the pad,
   wherein the edge ring support comprises a second plate on which the edge ring is detachably held,
   wherein the driving system comprises a support plate configured to fixedly support the second plate, and
   wherein the support plate is movable upward and downward through an inner opening of the first plate defined by the annular or ring shape.

2. The apparatus of claim 1, wherein the pad support is directly on a bottom wall of the chamber, and the edge ring support is movable upward and downward over the pad support.

3. The apparatus of claim 1, wherein the pad support comprises
   a guide wall protruding from an inner upper surface of the first plate.

4. The apparatus of claim 3, wherein the pad comprises a plurality of pad pieces that are arranged along a circumferential direction of the first plate to be spaced apart from each other.

5. The apparatus of claim 4, wherein the pad support further comprises guide partitions which are positioned between adjacent ones of the pad pieces to position the pad pieces, the guide partitions protrude from an upper surface of the first plate, and the guide wall and the guide partitions define a plurality of pad piece seating surfaces on the first plate.

6. The apparatus of claim 1, wherein the edge ring support comprises:
   the second plate having an annular-shaped recess in which the edge ring is seated; and
   a clamping member connected to an outer circumference of the second plate to secure the edge ring to the second plate.

7. The apparatus of claim 6, wherein the driving system comprises:
   a drive shaft connected to the support plate; and
   a driving portion configured to move the drive shaft upward and downward.

8. The apparatus of claim 7, wherein the support plate is movable upward and downward above the pad support.

9. The apparatus of claim 1, further comprising a pressurizing member on the second plate and configured to press the second plate against the first plate.

10. The apparatus of claim 1, wherein the pad comprises a ring-shaped continuous pad that is arranged along a circumferential direction of the first plate.

11. An apparatus comprising:
    a chamber defining a space for attaching a pad to an edge ring;
    a pad support within the chamber and on which the pad is disposed;
    a driving system within the chamber, the driving system including a support plate, a drive shaft connected to the support plate and a driving portion configured to move the drive shaft upward and downward;
    an edge ring support mountable on the support plate to face the pad support, the edge ring support detachably securing the edge ring thereon; and
    a vacuum exhaust system configured to create a vacuum atmosphere within the chamber,
    wherein the pad support comprises a first plate having an annular or ring shape to support the pad,
    wherein the edge ring support comprises a second plate on which the edge ring is detachably held,
    wherein the second plate is detachably mounted on a surface of the support plate, and
    wherein the support plate is movable upward and downward through an inner opening of the first plate defined by the annular or ring shape.

12. The apparatus of claim 11, wherein the pad support is detachably installed directly on a bottom wall of the chamber.

13. The apparatus of claim 12, wherein the pad comprises a plurality of pad pieces that are arranged along a circumferential direction of the first plate to be spaced apart from each other.

14. The apparatus of claim 11, wherein the edge ring support comprises
    a clamping member connected to an outer circumference of the second plate to secure the edge ring to the second plate.

15. The apparatus of claim 14, wherein an annular-shaped recess in which the edge ring is seated is defined in the second plate.

16. The apparatus of claim 11, wherein the pad support comprises a guide wall protruding from an inner upper surface of the first plate.

17. The apparatus of claim 16, wherein the pad comprises a plurality of pad pieces that are arranged along a circumferential direction of the first plate to be spaced apart from each other.

18. The apparatus of claim 17, wherein the pad support further comprises guide partitions which are positioned between adjacent ones of the pad pieces to position the pad pieces, the guide partitions protrude from an upper surface of the first plate, and the guide wall and the guide partitions define a plurality of pad piece seating surfaces on the first plate.

19. The apparatus of claim 11, further comprising a pressurizing member on the second plate and configured to press the second plate against the first plate.

* * * * *